(12) United States Patent
Taylor

(10) Patent No.: US 10,388,719 B2
(45) Date of Patent: Aug. 20, 2019

(54) LATERAL VOLTAGE VARIABLE CAPACITOR FABRICATION

(71) Applicant: Troy Randall Taylor, Newton, CT (US)

(72) Inventor: Troy Randall Taylor, Newton, CT (US)

( * ) Notice: Subject to any disclaimer, the term of this patent is extended or adjusted under 35 U.S.C. 154(b) by 0 days.

(21) Appl. No.: 15/700,083

(22) Filed: Sep. 9, 2017

(65) Prior Publication Data

US 2019/0081132 A1 Mar. 14, 2019

(51) Int. Cl.
*H01L 49/02* (2006.01)

(52) U.S. Cl.
CPC .................................... *H01L 28/60* (2013.01)

(58) Field of Classification Search
CPC .......... H01L 28/40; H01L 28/55; H01L 28/56; H01L 28/57; H01L 28/60; H01L 28/65; H01L 28/87–88; H01L 28/91–92
See application file for complete search history.

(56) References Cited

U.S. PATENT DOCUMENTS

| 2004/0241401 A1* | 12/2004 | Hunt | H01G 4/012 428/209 |
| 2009/0130457 A1* | 5/2009 | Kim | H01G 4/1218 428/432 |
| 2013/0320501 A1* | 12/2013 | Zhang | H01L 27/0808 257/595 |
| 2017/0069709 A1* | 3/2017 | Hsu | H01L 21/3212 |

* cited by examiner

*Primary Examiner* — Frederick B Hargrove

(57) ABSTRACT

Methods for fabricating a lateral voltage variable capacitor are disclosed. The voltage variable capacitor utilizes a dielectric material with an electric field dependent dielectric permittivity (dielectric constant). Various process steps are used including planarization to fabricate the lateral device structure.

11 Claims, 15 Drawing Sheets

LATERAL VOLTAGE VARIABLE CAPACITOR FABRICATION

PRIOR ART REFERENCES

U.S. PATENT DOCUMENTS

| | | |
|---|---|---|
| 5,246,468 | September 1993 | Takahashi et al. |
| 6,404,614 B1 | June 2002 | Zhu et al. |
| 7,038,266 B2 | May 2006 | Wang |
| 7,135,366 B2 | November 2006 | Rotella |
| 7,456,072 B2 | November 2008 | Olewine et al. |
| 7,728,377 B2 | June 2010 | Elsass et al. |
| 8,901,711 B1 | December 2014 | Yang et al. |
| 9,177,908 B2 | November 2015 | Liaw |
| 2004/0259316 A1 | December 2004 | Acikel et al. |
| 2013/0320501 A1 | December 2013 | Zhang et al. |
| 2014/0159201 A1 | June 2014 | Keller et al. |
| 2015/0200245 A1 | July 2015 | Yun et al. |

OTHER PUBLICATIONS

C. S. Hwang, "BST Thin Films for Ultra Large Scale DRAM. A Review on the Process Integration", Mater. Sci & Eng. B56, 1998, 178-190.

D. E. Kotecki, "BST Dielectrics for Future Stacked Capacitor DRAM", IBM J. Res. Dev. 43, May 1999, 367-382.

S. Ezhilvalavan, "Review: Progress in the Development of BST Thin Films for Gigabit Era DRAMs", Mat. Chem. & Phys. 65, 2000, 227-248.

T. R. Taylor, *Stoichiometry and thermal mismatch effects on sputtered barium strontium titanate thin films*, Ph.D. Thesis, University of California Santa Barbara, 2003.

P. Pao et al., "Barium strontium titanate thin film varactors for room temperature microwave device applications", J. Phys D: Appl. Phys 41, 063001 (2008).

R. York, "Chapter 4: Tunable Dielectrics for RF Circuits", *Multifunctional Adaptive Microwave Circuits and Systems*, SciTech Publishing, 2009.

L. B. Kong et al., "Electrically tunable dielectric materials and strategies to improve their performance", Progress in Materials Science 55 (2010) 840-893.

G. Subramanyam et al., "Challenges and opportunities for multi-functional oxide thin films for voltage tunable radio frequency/microwave components", J. Applied Phys 114, 191301 (2013).

FIELD OF INVENTION

The present disclosure generally relates to microelectronic device structure and a forming method thereof. More specifically, the present disclosure relates to lateral metal insulator metal (MIM) capacitors, lateral voltage variable capacitors, and dielectric materials with an electric field dependent dielectric permittivity (dielectric constant).

BACKGROUND

Capacitors are a fundamental building block in electronic devices and circuits. Essentially capacitors are comprised by two conductive plates separated by an insulator or dielectric. By using a dielectric material with an electric field dependent dielectric permittivity (dielectric constant), voltage variable capacitors also known as varactors can be realized. The capacitance of a varactor can be tuned by changing the bias voltage across the capacitor. The added flexibility of a voltage tunable capacitance is highly desirable as there is a significant demand in microelectronic and semiconductor device technology to integrate as much functionality as possible into a device, circuit, chip, or die. Varactors have wide applications in electrically tuned devices and circuits such as tunable filters, phase shifters, voltage controlled oscillators, impedance matching networks, and numerous others.

Electric field tunable dielectric materials such as barium strontium titanate (BST), potassium tantalum niobate (KTN), silver tantalum niobate (ATN) and bismuth zinc niobate (BZN) can be integrated into MIM capacitors through thin film deposition and semiconductor processing technology. This allows the integration of many tunable dielectric varactors onto a single wafer and with other circuitry. Most commonly, the MIM capacitor structure is a parallel plate configuration. A metal bottom electrode is deposited on a substrate. A tunable dielectric material is deposited over the bottom electrode. A top electrode is deposited on the tunable dielectric material. Additional removal and patterning steps maybe required to define the MIM structure, but the MIM structure is defined vertically.

Tunable dielectrics such as BST present integration challenges to conventional MIM capacitor fabrication. Tunable dielectrics typically require higher processes temperatures and place limits on the materials that can be employed in device integration. Tunable dielectric processing and process temperature requirements limit electrode metal choices as electrode metal choices limit the temperatures for tunable dielectric processing. This presents two issues: (1) tunable dielectrics cannot be processed at higher temperatures more ideal to produce better dielectric properties such as low dielectric loss, and (2) high conductivity metals such as copper (Cu), silver (Ag), gold (Au), and aluminum (Al) cannot be integrated into the device structure due to process conditions and temperatures that result in metal degradation. There is a need for a fabrication method that can simplify tunable dielectric integration and produce high performance tunable dielectric varactors.

SUMMARY OF INVENTION

The present invention overcomes the limitations of tunable dielectric voltage variable capacitors with a lateral voltage variable capacitor fabrication process. The various fabrication embodiments utilize planarization that enables the separation of tunable dielectric processing from electrode metallization. With tunable dielectric processing independent of any metal, more appropriate thermal conditions can be employed. The tunable dielectric process can include higher temperatures that in the prior art have been limited by the presence of a metal electrode and its related degradation under higher temperatures (>800° C.). Higher tunable dielectric process temperatures (>800° C.) are ideal for producing improved dielectric properties such as low dielectric loss. Metallization is after tunable dielectric processing and completely avoids the associated elevated temperatures. Greater flexibility is allowed with metal selection, and high conductivity metals such as gold, silver, and copper can be integrated with no tunable dielectric processing temperature compatibility concerns. The process embodiments include additional fabrication steps including tunable dielectric deposition, dielectric deposition, metallization, etching steps, and others. In one aspect of the invention a metal planarization step enables the lateral device structure. In a second aspect of the invention two planarization steps are utilized for lateral varactor fabrication.

BRIEF DESCRIPTION OF THE DRAWINGS

The invention has advantages that will be detailed and illustrated by the accompanying drawings.

DETAILED DESCRIPTION OF THE INVENTION

Numerous details are set forth in the following description. The details include structures, components, materials, processing steps, and processing techniques. This is done to provide an understanding of the application. It will be appreciated by one of ordinary skill in the art that the present application may be practiced with viable alternative process options with these details. Well known structures and processing steps have not been described in detail to avoid obscuring the various embodiments of the present application.

Figure 1A:
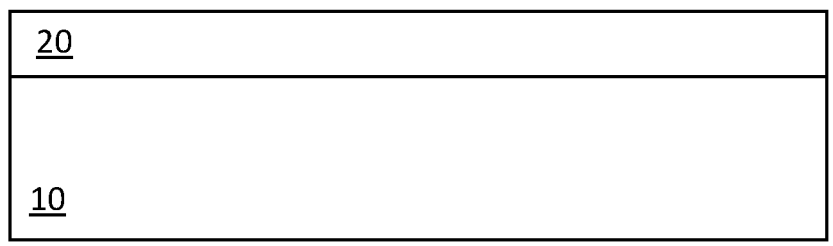
FIG. 1A is a cross sectional view of a tunable dielectric film on a substrate.

FIGS. 1A through 1F detail a lateral varactor fabrication process. FIG. 1A illustrates a dielectric layer 20 on a substrate 10. The substrate 10 may comprise a semiconducting material, or insulating material. When the substrate is composed of a semiconductor material any of the following maybe used: silicon, high resistivity silicon, silicon carbide, silicon on insulator, silicon germanium, germanium, gallium arsenide, gallium nitride, indium arsenide, indium phosphide, and other III/V or II/VI compound semiconductors. Further, the substrate may comprise of the following: magnesium oxide, alumina, sapphire, lanthanum aluminate, glass, quartz, aluminum nitride, and any material classified as low temperature co-fired ceramic (LTCC).

The dielectric layer 20 may comprise of a material with an electric field dependent dielectric permittivity including but not limited to: barium strontium titanate (BST, $Ba_{1-x}Sr_xTiO_3$), potassium tantalum niobate (KTN, $KTa_{1-x}Nb_xO_3$), lead zirconium titanate (PZT, $PbZr_{1-x}Ti_xO_3$), silver tantalum niobate (ATN, $AgTa_{1-x}Nb_xO_3$), bismuth zinc niobate (BZN, $(Bi,Zn)_2(Zn,Nb)_2O_7$), or a combination thereof. The dielectric layer 20 may include other dielectric materials forming a plurality of dielectric layers including but not limited to the following oxides, nitrides, and oxy-nitrides: $Al_2O_3$, AlN, $Al_2O_xN_y$, $HfO_2$, $HfO_xN_y$, $La_2O_3$, $La_2O_xN_y$, $LaAlO_3$, $LaAlO_xN_y$, MgO, $Nb_2O_5$, $Nb_2O_xN_y$, $SiO_2$, SiN, $Si_3N_4$, SiON, $SiN_x$, $Ta_2O_5$, $Ta_2O_xN_y$, $TiO_2$, TiN, $TiO_xN_y$, $Y_2O_3$, $YO_xN_y$, $ZrO_2$, and $ZrO_xN_y$. The dielectric layer 20 can be formed by utilizing a deposition process for example such as chemical vapor deposition (CVD), plasma enhanced chemical vapor deposition (PECVD), metal organic chemical vapor deposition (MOCVD), atomic layer deposition (ALD), spin on coating, chemical solution deposition (CSD), evaporation, molecular beam epitaxy (MBE), a sputtering method, or combination thereof. Thermal processing steps such as bakes and high temperature anneals, multiple or single steps, maybe required, included, or follow dielectric layer 20 formation.

Figure 1B:
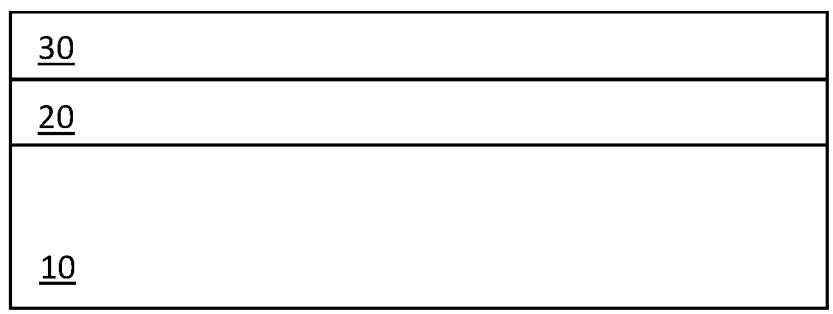
FIG. 1B is a cross sectional view of a dielectric layer deposited on the tunable dielectric.

FIG. 1B illustrates a dielectric layer 30 deposited over dielectric layer 20. The dielectric layer 30 may include other dielectric materials forming a plurality of dielectric layers including but not limited to the following oxides, nitrides, and oxy-nitrides: $Al_2O_3$, AlN, $Al_2O_xN_y$, $HfO_2$, $HfO_xN_y$, $La_2O_3$, $La_2O_xN_y$, $LaAlO_3$, $LaAlO_xN_y$, MgO, $Nb_2O_5$, $Nb_2O_xN_y$, $SiO_2$, SiN, $Si_3N_4$, SiON, $SiN_x$, $Ta_2O_5$, $Ta_2O_xN_y$, $TiO_2$, TiN, $TiO_xN_y$, $Y_2O_3$, $YO_xN_y$, $ZrO_2$, and $ZrO_xN_y$. The dielectric layer 30 can be formed by utilizing a deposition process for example such as chemical vapor deposition (CVD), plasma enhanced chemical vapor deposition (PECVD), metal organic chemical vapor deposition (MOCVD), atomic layer deposition (ALD), spin on coating, chemical solution deposition (CSD), evaporation, molecular beam epitaxy (MBE), a sputtering method, or combination thereof. The dielectric layer 30 may be utilized as a protective or passivation layer for dielectric layer 20 during subsequent process steps such as planarization and may also serve as a hard mask for subsequent etching steps. Thermal processing steps such as bakes and high temperature anneals, multiple or single steps, maybe required, included, or follow dielectric layer 30 formation.

Figure 1C:
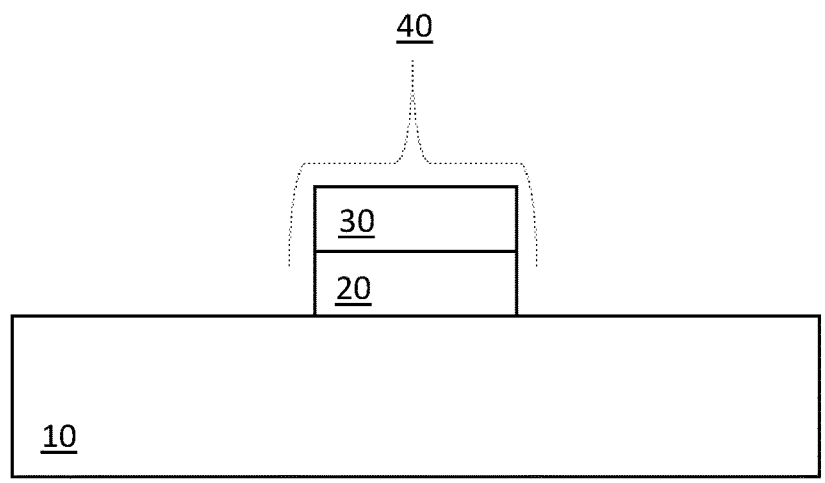
FIG. 1C is a cross sectional and top view of the patterned stack structure of the tunable dielectric film and dielectric layer. The cross section is taken on line A-A.
Figure 1C:
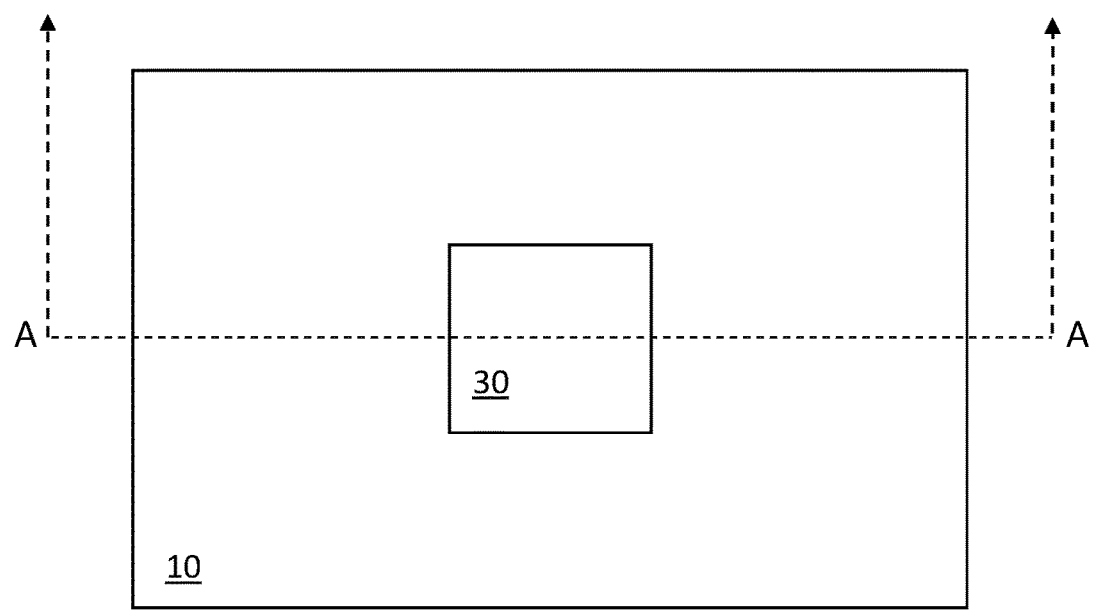

FIG. 1C illustrates the patterned dielectric film stack 40 consisting of dielectric layer 30 and dielectric layer 20. If a dielectric layer 30 is not used or not required then the patterned dielectric film stack would be dielectric layer 20. An etching step or combination of etching steps is utilized to fabricate the patterned dielectric film stack 40. A typical exposure and etch process with photoresist and a photolithography mask can be used to pattern the film stack. In one embodiment, the typical exposure and etch process may use a hard mask that is composed of an oxide, nitride, oxynitride, or combination thereof. The hard mask can be formed utilizing a deposition process including, for example, atomic layer deposition (ALD), chemical vapor deposition (CVD), plasma enhanced chemical vapor deposition (PECVD), chemical solution deposition (CSD), physical vapor deposition (PVD), evaporation, a sputtering method, or combination thereof. The etching may include any wet chemical etching process, dry plasma etching process (reactive ion etching, ion beam etching, plasma etching, ion milling, or laser ablation), other like etching processes, or combination thereof. Etching defines the sidewalls consisting of the dielectric layers in the dielectric film stack 40 that will be the contact surface of the lateral varactor. The sidewalls not used as contacts can vary as dielectric layer 30 may encapsulate dielectric layer 20 or dielectric layer 20 maybe exposed.

Figure 1D:
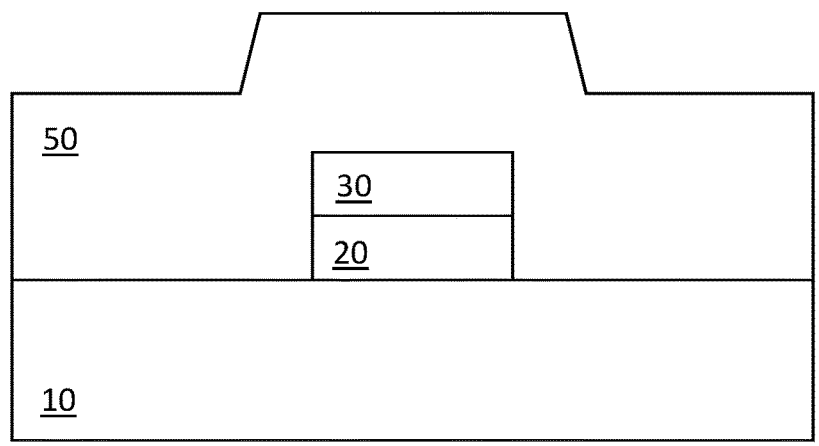
FIG. 1D is a cross sectional and top view after metal deposition on the patterned dielectric stack structure. The cross section is taken on line A-A.
Figure 1D:
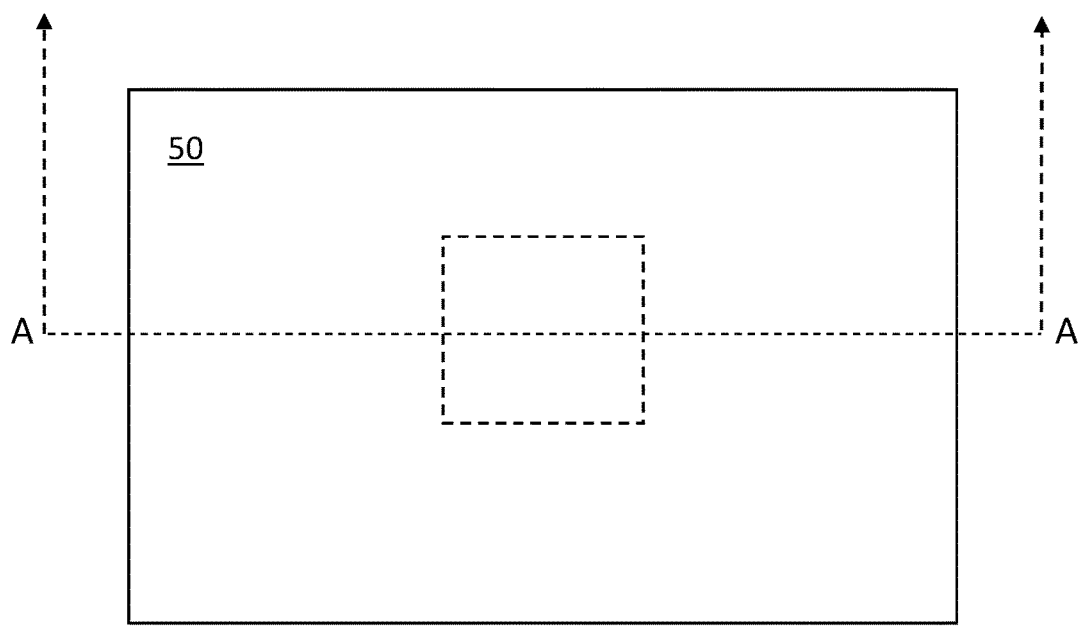

FIG. 1D illustrates the metal layer 50 deposited on the substrate and over the dielectric film stack 40. The metal layer 50 can be deposited by evaporation, sputtering, atomic layer deposition (ALD), chemical vapor deposition (CVD), plasma enhanced chemical vapor deposition (PECVD), electroplating, or combination thereof. The metal layer 50 may consist of a plurality of metal layers including Au, Ag, Cu, Pt, Al, and alloys among others. The metal layer 50 is deposited over the dielectric film stack 40 with a sufficient thickness to accommodate the dielectric film stack 40 step height/thickness for producing a planar surface or coplanar surfaces in subsequent planarization process steps.

A two-step metallization process can be used, although not pictured. Metal could be selectively applied by a lift off process prior to blanket metallization across the entire substrate. This gives the flexibility of addressing the device structure with specific metals that may not be desirable in other locations if for example they prove difficult to remove or etch.

Figure 1E:
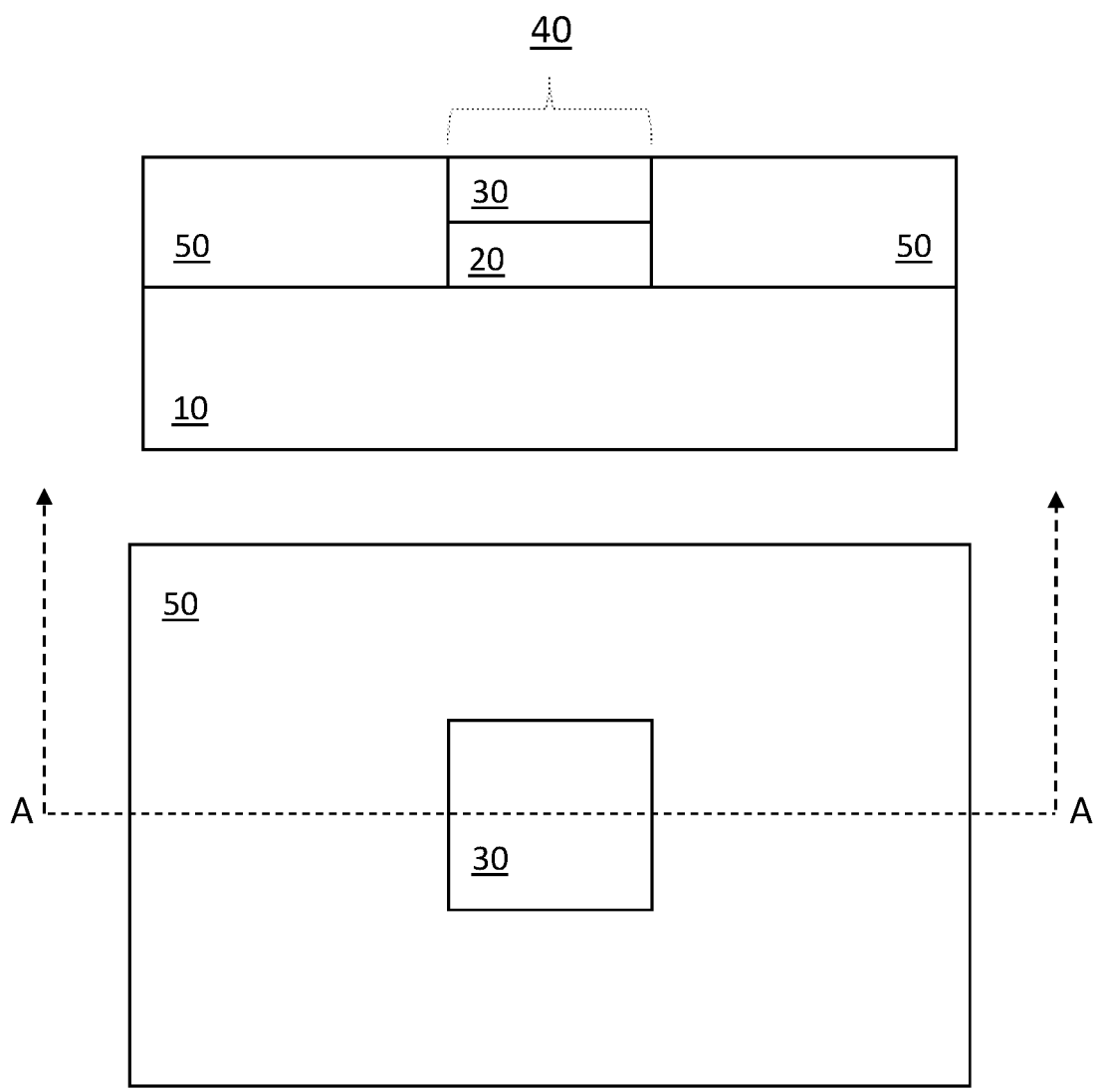
FIG. 1E is a cross sectional and top view after planarization of the deposited metal. The cross section is taken on line A-A.

FIG. 1E illustrates the structure after planarization. The planarization can be performed by chemical mechanical planarization/polishing (CMP) and/or grinding. The metal layer 50 is removed to expose the top surface of the dielectric film stack 40. The top surface of the metal layer 50 and the top surface of the dielectric film stack 40 are essentially coplanar. The top surface of the dielectric film stack 40 will be the top surface of the dielectric layer 30. If no dielectric layer 30 is used, the top surface of the dielectric film stack 40 is the top surface of dielectric layer 20.

Figure 1F:
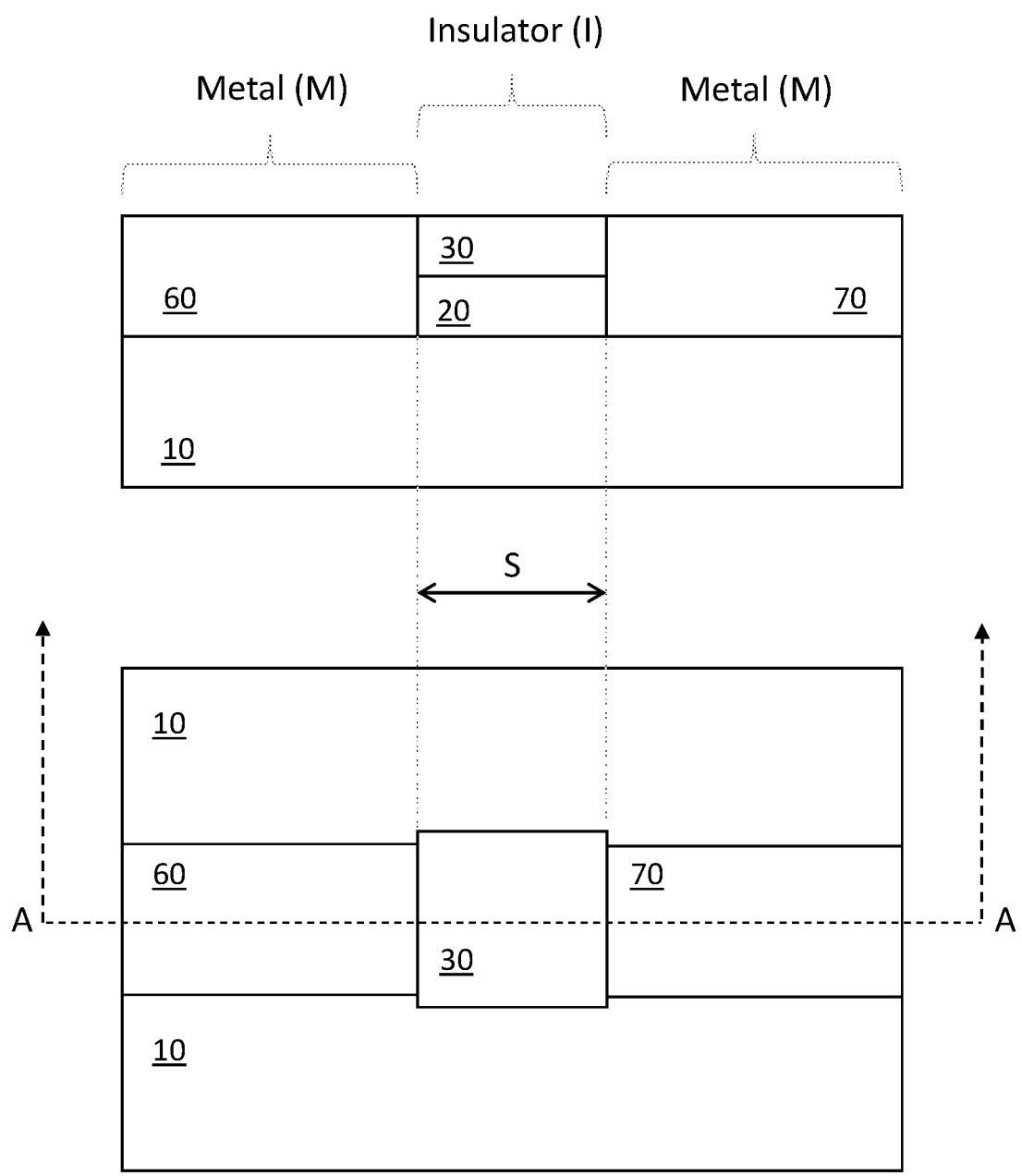
FIG. 1F is a cross sectional and top view after patterning the planarized metal layer to define a lateral MIM structure. The cross section is taken on line A-A.

FIG. 1F illustrates the lateral MIM structure produced after etching the metal layer 50. An etching step or combination of etching steps is utilized. A typical exposure and etch process with photoresist and a photolithography mask can be used to pattern the metal layer 50. In one embodiment, the typical exposure and etch process may use a hard mask that is composed of an oxide, nitride, oxynitride, or combination thereof. The hard mask can be formed utilizing a deposition process including, for example, chemical vapor deposition (CVD), plasma enhanced chemical vapor deposition (PECVD), chemical solution deposition, physical vapor deposition, evaporation, or a sputtering technique. The etching may include any wet chemical etching process, dry plasma etching process (reactive ion etching, ion beam etching, plasma etching, or laser ablation), or other like etching processes. After etching the metal layer 50, the MIM structure is comprised of a first electrode 60, the dielectric film stack 40 consisting of the dielectric layer 30 and dielectric layer 20, and a second electrode 70. The first electrode 60 and second electrode 70 are positioned on opposite sides of the dielectric film stack 40 and make contact on the dielectric film stack 40 side wall. The electrode separation between the first electrode 60 and second electrode 70 is depicted in FIG. 1F as "S". The sidewall contact area, the electrode separation (S), and the dielectric materials involved impact the capacitance of the lateral MIM varactor. In the top view of FIG. 1F, width is defined as perpendicular to electrode separation (S). The width of the first electrode 60, dielectric film stack 40, and second electrode 70 may vary from what is depicted depending on requirements of the lateral varactor, device design, and device layout.

Figure 2A:
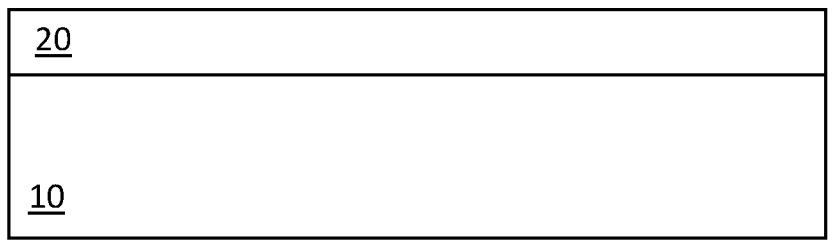
FIG. 2A is a cross sectional and top view of a tunable dielectric film on a substrate. The cross section is taken on line A-A.
Figure 2A:

FIGS. 2A through 2H detail a lateral varactor fabrication process. FIG. 2A illustrates a dielectric layer 20 on a substrate 10. The substrate 10 may comprise a semiconducting material, or insulating material. When the substrate is composed of a semiconductor material any of the following maybe used: silicon, high resistivity silicon, silicon carbide, silicon on insulator, silicon germanium, germanium, gallium arsenide, gallium nitride, indium arsenide, indium phosphide, and other III/V or II/VI compound semiconductors. Further, the substrate may comprise of the following: magnesium oxide, alumina, sapphire, lanthanum aluminate, glass, quartz, aluminum nitride, and any material classified as low temperature co-fired ceramic (LTCC).

The dielectric layer 20 may comprise of a material with an electric field dependent dielectric permittivity including but not limited to: barium strontium titanate (BST, $Ba_{1-x}Sr_xTiO_3$), potassium tantalum niobate (KTN, $KTa_{1-x}Nb_xO_3$), lead zirconium titanate (PZT, $PbZr_{1-x}Ti_xO_3$), silver tantalum niobate (ATN, $AgTa_{1-x}Nb_xO_3$), bismuth zinc niobate (BZN, $(Bi,Zn)_2(Zn,Nb)_2O_7$), or a combination thereof. The dielectric layer 20 may include other dielectric materials forming a plurality of dielectric layers including but not limited to the following oxides, nitrides, and oxy-nitrides: $Al_2O_3$, AlN, $Al_2O_xN_y$, $HfO_2$, $HfO_xN_y$, $La_2O_3$, $La_2O_xN_y$, $LaAlO_3$, $LaAlO_xN_y$, MgO, $Nb_2O_5$, $Nb_2O_xN_y$, $SiO_2$, SiN, $Si_3N_4$, SiON, $SiN_x$, $Ta_2O_5$, $Ta_2O_xN_y$, $TiO_2$, TiN, $TiO_xN_y$, $Y_2O_3$, $YO_xN_y$, $ZrO_2$, and $ZrO_xN_y$. The dielectric layer 20 can be formed by utilizing a deposition process for example such as chemical vapor deposition (CVD), plasma enhanced chemical vapor deposition (PECVD), metal organic chemical vapor deposition (MOCVD), atomic layer deposition (ALD), spin on coating, chemical solution deposition (CSD), evaporation, molecular beam epitaxy (MBE), a sputtering method, or combination thereof. Thermal processing steps such as bakes and high temperature anneals, multiple or single steps, maybe required, included, or follow dielectric layer 20 formation.

Figure 2B:
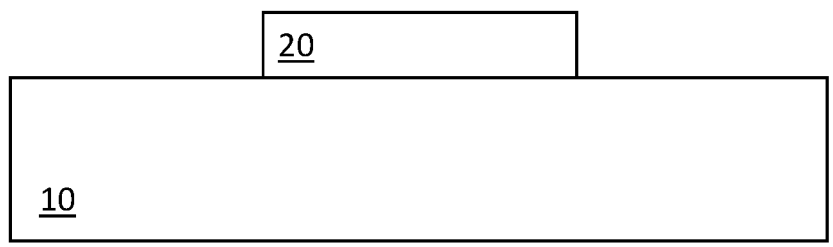
FIG. 2B is a cross sectional and top view of the patterned tunable dielectric film after etching. The cross section is taken on line A-A.
Figure 2B:
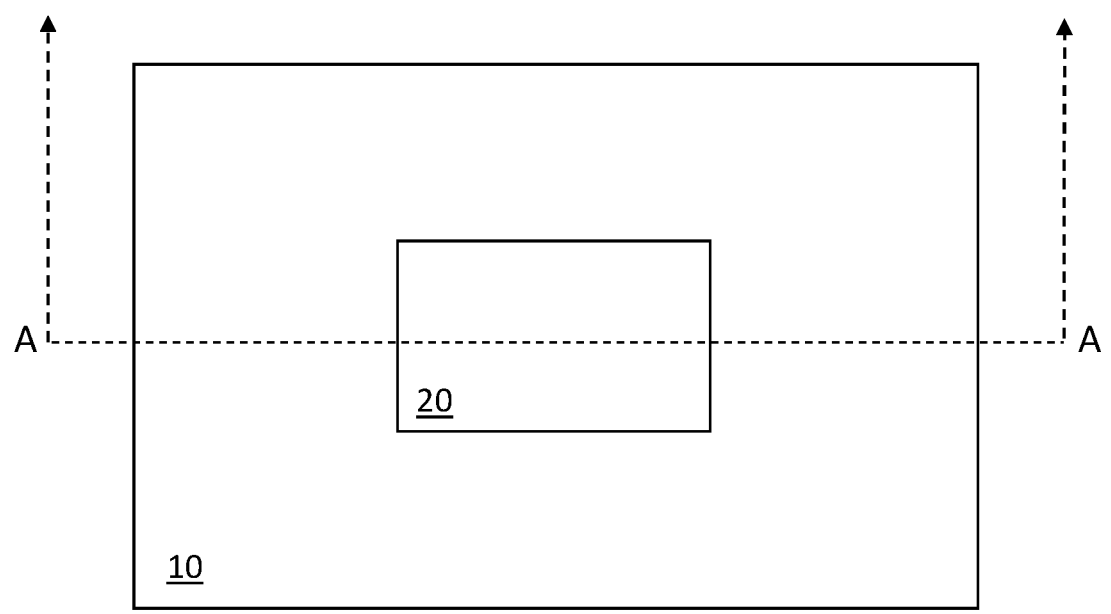

FIG. 2B illustrates a patterned dielectric layer 20. An etching step or combination of etching steps is utilized to fabricate the patterned dielectric layer. A typical exposure and etch process with photoresist and a photolithography mask can be used to pattern the dielectric layer. In one embodiment, the typical exposure and etch process may use a hard mask that is composed of an oxide, nitride, oxynitride, or combination thereof. The hard mask can be formed utilizing a deposition process including, for example, atomic layer deposition (ALD), chemical vapor deposition (CVD), plasma enhanced chemical vapor deposition (PECVD), chemical solution deposition (CSD), physical vapor deposition (PVD), evaporation, a sputtering technique, or combination thereof. The etching may include any wet chemical etching process, dry plasma etching process (reactive ion etching, ion beam etching, plasma etching, ion milling, or laser ablation), or other like etching processes.

Figure 2C:
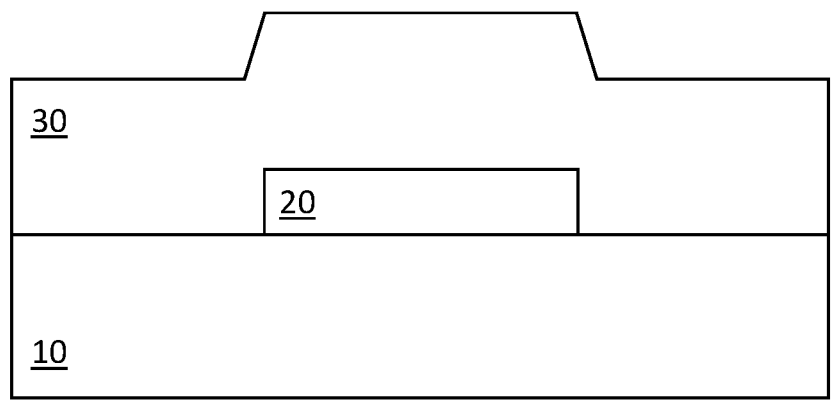
FIG. 2C is a cross sectional and top view of a dielectric layer over the tunable dielectric layer. The cross section is taken on line A-A.
Figure 2C:
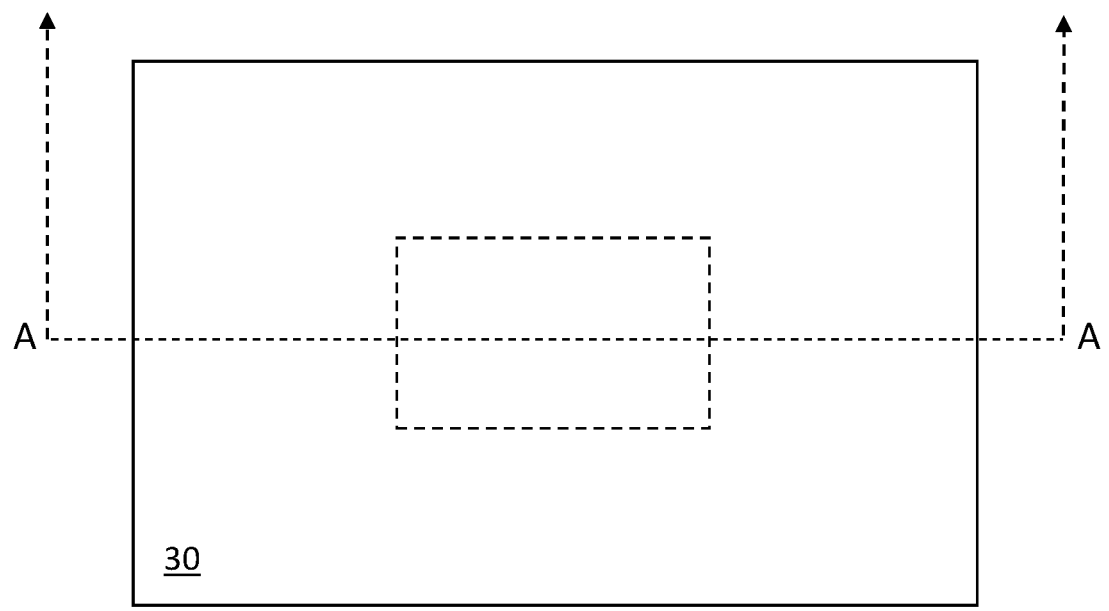

FIG. 2C illustrates a dielectric layer 30 deposited over the patterned dielectric layer 20. The dielectric layer 30 may include other dielectric materials forming a plurality of dielectric layers including but not limited to the following oxides, nitrides, and oxy-nitrides: $Al_2O_3$, AlN, $Al_2O_xN_y$, $HfO_2$, $HfO_xN_y$, $La_2O_3$, $La_2O_xN_y$, $LaAlO_3$, $LaAlO_xN_y$, MgO, $Nb_2O_5$, $Nb_2O_xN_y$, $SiO_2$, SiN, $Si_3N_4$, SiON, $SiN_x$, $Ta_2O_5$, $Ta_2O_xN_y$, $TiO_2$, TiN, $TiO_xN_y$, $Y_2O_3$, $YO_xN_y$, $ZrO_2$, and $ZrO_xN_y$. The dielectric layer 30 can be formed by utilizing a deposition process for example such as chemical vapor deposition (CVD), plasma enhanced chemical vapor deposition (PECVD), metal organic chemical vapor deposition (MOCVD), atomic layer deposition (ALD), spin on coating, chemical solution deposition (CSD), evaporation, molecular beam epitaxy (MBE), a sputtering method, or combination thereof. The dielectric layer 30 may serve as a protective or passivation layer for the dielectric layer 20 during planarization. If the dielectric layer 20 does not require protection during planarization, the dielectric layer 30 may not be required. The dielectric layer 30 may also serve as a hard mask for subsequent etching steps. The dielectric layer 30 is deposited over the dielectric layer 20 with a sufficient thickness to accommodate the dielectric layer 20 step height/thickness for producing a planar surface in subsequent planarization process steps. Thermal processing steps such as bakes and high temperature anneals, multiple or single steps, maybe required, included, or follow dielectric layer 30 formation.

Figure 2D:
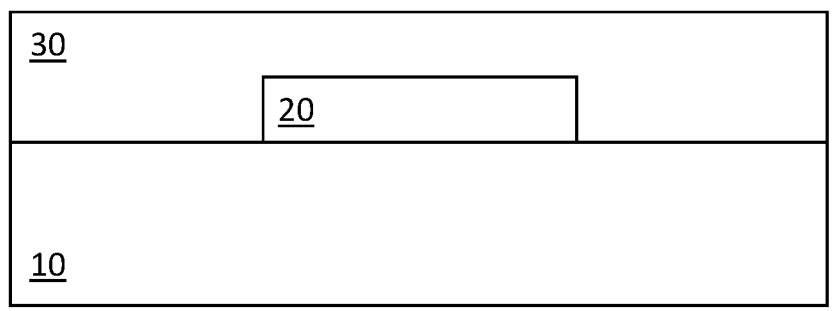
FIG. 2D is a cross sectional and top view after planarization of the deposited dielectric layer. The cross section is taken on line A-A.
Figure 2D:
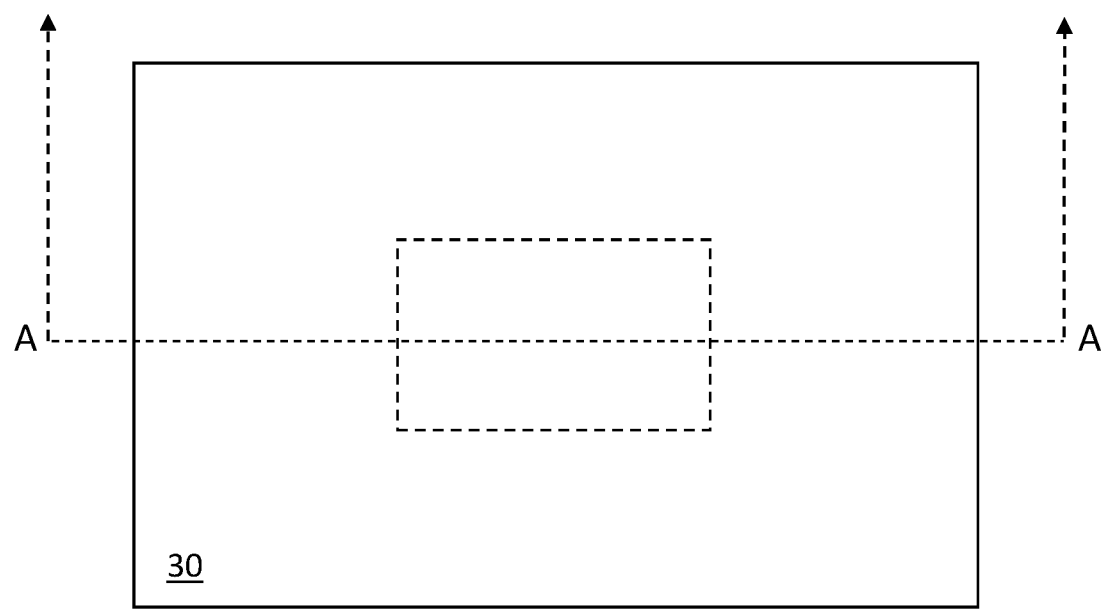

FIG. 2D illustrates the structure after planarization. The planarization can be performed by chemical mechanical planarization/polishing (CMP) and/or grinding. The dielectric layer 30 is planarized resulting with the dielectric layer 30 deposited over the dielectric layer 20 being essentially coplanar with the rest of the dielectric layer 30.

Figure 2E:
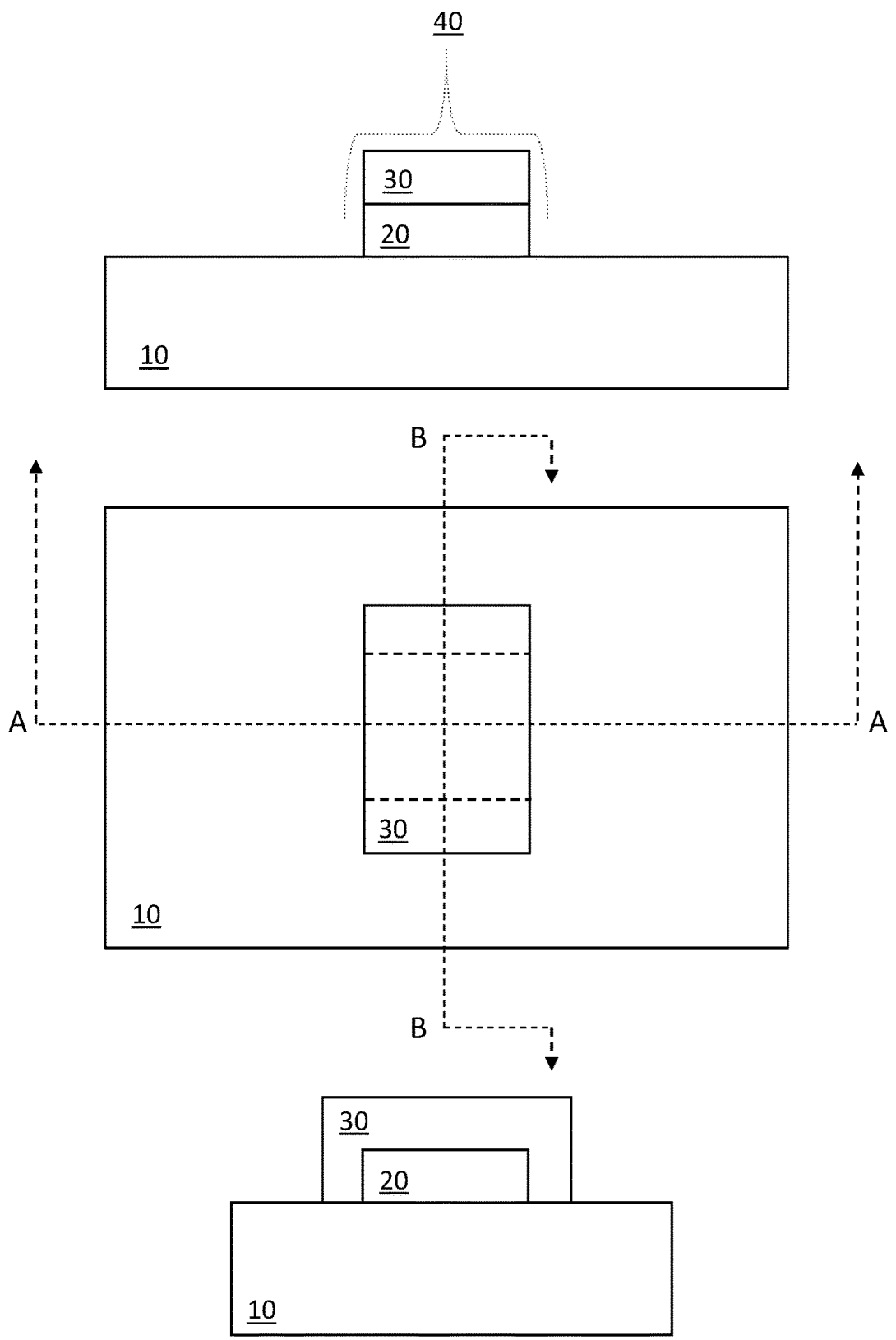
FIG. 2E is one top view and two cross sections of the patterned tunable dielectric and dielectric layer stacked structure after etching. The cross sections are taken on lines A-A and B-B.

FIG. 2E illustrates the dielectric film stack 40 consisting of dielectric layer 30 and dielectric layer 20. An etching step or combination of etching steps is utilized to fabricate the patterned stack. A typical exposure and etch process with photoresist and a photolithography mask can be used to pattern the dielectric film stack 40. In one embodiment, the typical exposure and etch process may use a hard mask that is composed of an oxide, nitride, oxynitride, or combination thereof. The hard mask can be formed utilizing a deposition process including, for example, atomic layer deposition (ALD), chemical vapor deposition (CVD), plasma enhanced chemical vapor deposition (PECVD), metal organic chemical vapor deposition (MOCVD), chemical solution deposition (CSD), physical vapor deposition (PVD), evaporation, a sputtering technique, or combination thereof. The etching may include any wet chemical etching process, dry plasma etching process (reactive ion etching, ion beam etching, plasma etching, ion milling, or laser ablation), or other like etching processes. Etching defines the sidewalls consisting of the dielectric layers in the dielectric film stack 40 that will be the contact surface of the lateral varactor. The sidewalls not used as contacts can vary as dielectric layer 30 may encapsulate dielectric layer 20 or dielectric layer 20 maybe exposed.

Figure 2F:
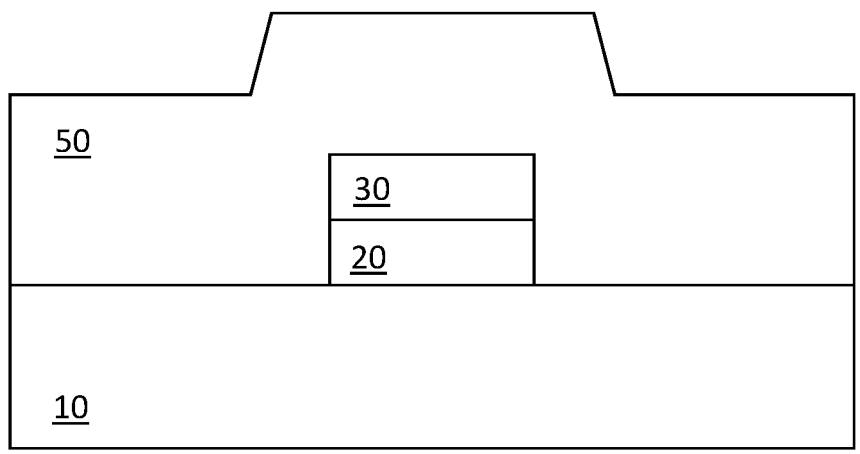
FIG. 2F is a cross sectional and top view after metal deposition on the layered structure. The cross section is taken on line A-A.
Figure 2F:
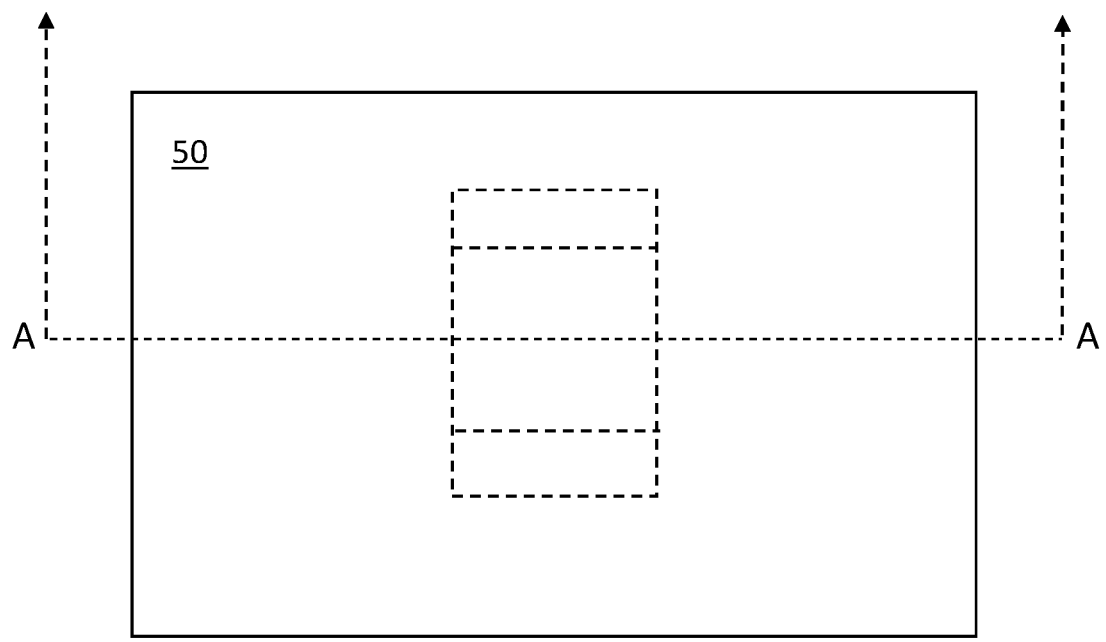

FIG. 2F illustrates the metal layer 50 deposited on the substrate and over the dielectric film stack 40. The metal layer 50 can be deposited by evaporation, sputtering, atomic layer deposition (ALD), chemical vapor deposition (CVD), plasma enhanced chemical vapor deposition (PECVD), metal organic chemical vapor deposition (MOCVD), electroplating, or a combination thereof. The metal layer 50 may consist of a plurality of metal layers including Au, Ag, Cu, Pt, Al, and alloys among others. The metal layer 50 is deposited over the dielectric film stack 40 with a sufficient thickness to accommodate the dielectric film stack 40 step height for producing a planar surface in subsequent planarization process steps.

A two-step metallization process can be used, although not pictured. Metal could be deposited and etched or selectively applied by a lift off process prior to blanket metallization across the entire substrate. This gives the flexibility of addressing the device structure with specific metals that may not be desirable in other locations if they prove difficult to remove or etch.

Figure 2G:
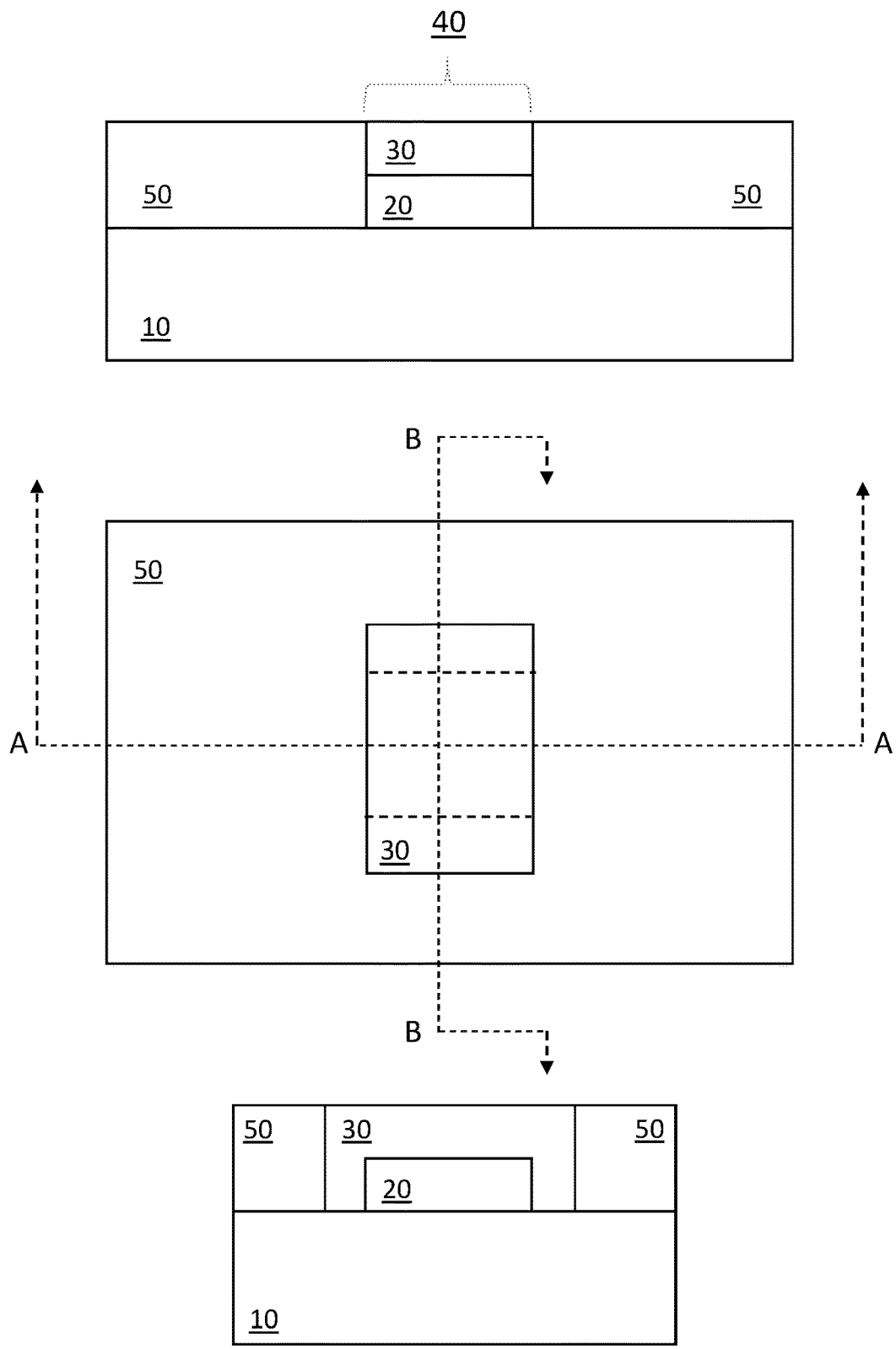
FIG. 2G is one top view and two cross sections after planarization of the deposited metal. The cross sections are taken on lines A-A and B-B.

FIG. 2G illustrates the structure after metal planarization. The planarization can be performed by chemical mechanical planarization/polishing (CMP) and/or grinding. The metal layer 50 is removed to expose the top surface of the dielectric film stack 40. The top surface of the metal layer 50 and the top surface of the dielectric film stack 40 are essentially coplanar. The top surface of the dielectric film stack 40 will be the top surface of the dielectric layer 30.

Figure 2H:
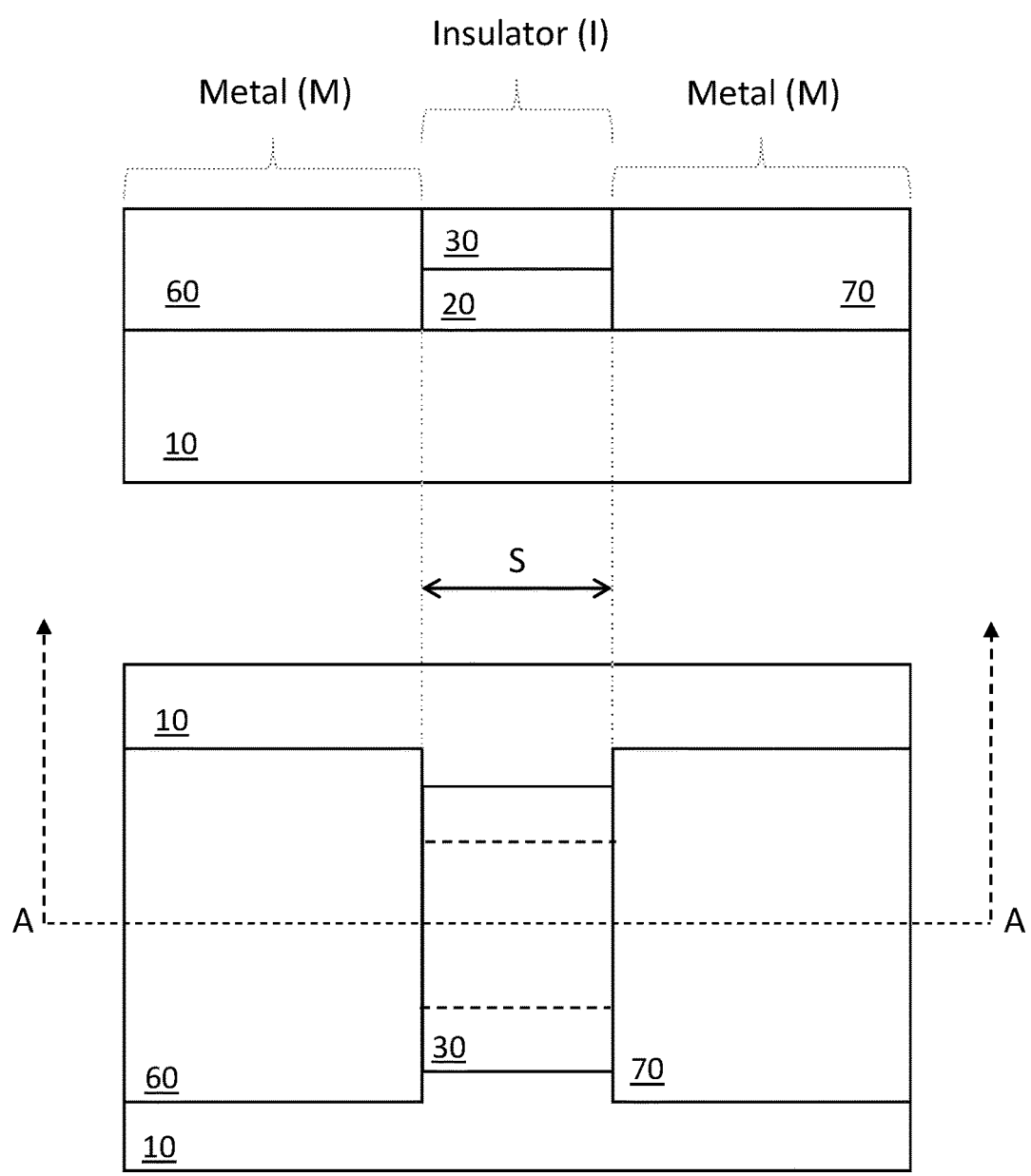
FIG. 2H is a cross sectional and top view after patterning the planarized metal layer to define a lateral MIM structure. The cross section is taken on line A-A.

FIG. 2H illustrates the lateral MIM structure produced after etching the metal layer 50. An etching step or combination of etching steps is utilized. A typical exposure and etch process with photoresist and a photolithography mask can be used to pattern the metal layer 50. In one embodiment, the typical exposure and etch process may use a hard mask that is composed of an oxide, nitride, oxynitride, or combination thereof. The hard mask can be formed utilizing a deposition process including, for example, chemical vapor deposition (CVD), plasma enhanced chemical vapor deposition (PECVD), chemical solution deposition, physical vapor deposition, evaporation, or a sputtering technique. The etching may include any wet chemical etching process, dry plasma etching process (reactive ion etching, ion beam etching, plasma etching, or laser ablation), or other like etching processes. After etching the MIM structure is comprised of a first electrode 60, the dielectric film stack 40 consisting of the dielectric layer 30 and dielectric layer 20, and a second electrode 70. The first electrode 60 and second electrode 70 are positioned on opposite sides of the dielectric film stack 40 and make contact on the dielectric film stack 40 side wall. The electrode separation between the first electrode 60 and second electrode 70 is depicted in FIG. 2H as "S". The sidewall contact area, the electrode separation (S), and the dielectric materials employed impact the capacitance of the lateral MIM varactor. In the top view of FIG. 2H, width is defined as perpendicular to electrode separation (S). The width of the first electrode 60, dielectric film stack 40, and second electrode 70 may vary from what is depicted depending on requirements of the lateral varactor, device design, and device layout.

Figure 3A:
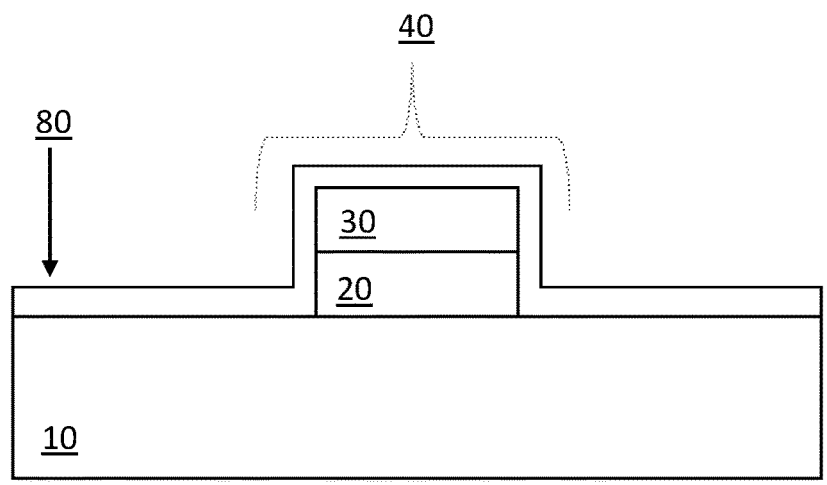
FIG. 3A is a cross sectional and top view of a dielectric layer deposited on the substrate and over the patterned dielectric film stack.
Figure 3A:
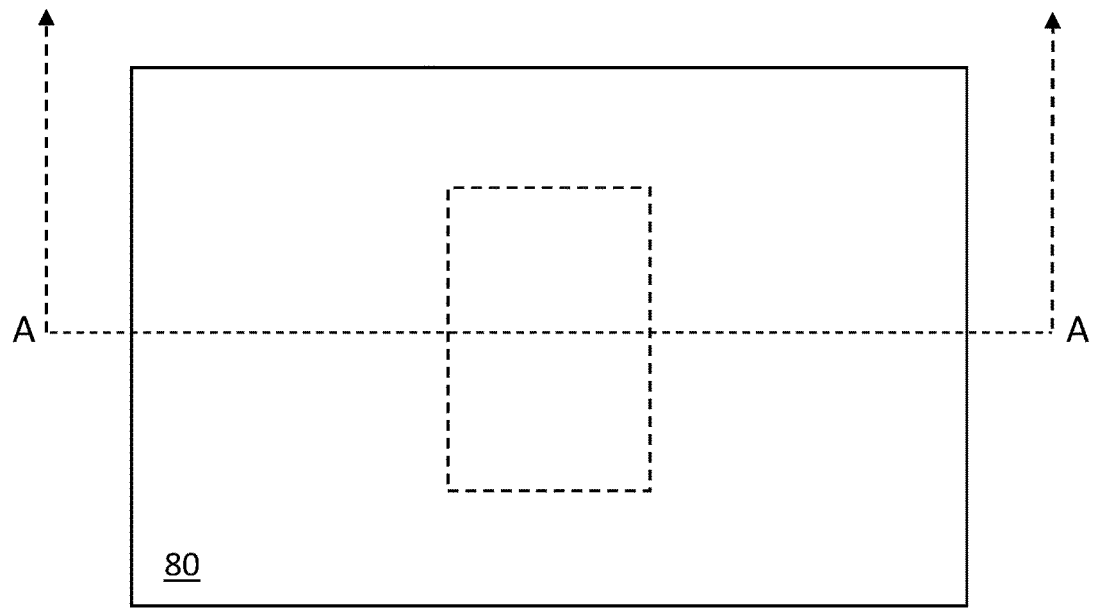

FIG. 3A illustrates a dielectric layer 80 deposited over the patterned dielectric film stack 40. This process step would follow patterned film stack fabrication as previously shown in FIG. 1C and FIG. 2E. This dielectric layer 80 encapsulates the patterned dielectric film stack 40 by covering the top surface and sidewalls. The dielectric layer 80 could be formed across the entire substrate or in selective areas by using the appropriate masking and etching strategies. The dielectric layer 80 can be formed utilizing a deposition process including, for example, atomic layer deposition (ALD), chemical vapor deposition (CVD), plasma enhanced chemical vapor deposition (PECVD), chemical solution deposition (CSD), physical vapor deposition (PVD), evaporation, a sputtering method, or combination thereof. The dielectric layer 80 may include other dielectric materials forming a plurality of dielectric layers including but not limited to the following oxides, nitrides, and oxy-nitrides: $Al_2O_3$, AlN, $Al_2O_xN_y$, $HfO_2$, $HfO_xN_y$, $La_2O_3$, $La_2O_xN_y$, $LaAlO_3$, $LaAlO_xN_y$, MgO, $Nb_2O_5$, $Nb_2O_xN_y$, $SiO_2$, SiN, $Si_3N_4$, SiON, SiN, $Ta_2O_5$, $Ta_2O_xN_y$, $TiO_2$, TiN, $TiO_xN_y$, $Y_2O_3$, $YO_xN_y$, $ZrO_2$, and $ZrO_xN_y$. The dielectric layer 80 can be used to control the sidewall interface and electrical contact. The dielectric layer 80 also enables varactor designs with a series dielectric, for example, as an additional means to control capacitance.

Various modifications may be made to the illustrated embodiments without departing from the spirit and scope of the invention. Although the sidewall of the dielectric film stack 40 is shown as vertical, the sidewall may have an angle. With a sidewall angle, the electrode separation will change through the thickness of the dielectric film stack. The lateral MIM capacitor is shown directly on a substrate 10. This is done for convenience, and other layers or structures can be located between the lateral MIM capacitor shown in FIG. 1H and FIG. 2H and the substrate 10. Each layer 20, 30, and 50 can also include one or more types of materials even though they are shown as single layers of material. The sidewall of the lateral MIM device, parallel with electrode separation, may consist of only one dielectric layer (20 or 30), both dielectric layers (20 and 30), or utilize additional steps, layers, and materials for further encapsulation. Additional layers may be used for various purposes according to conventional techniques such as to increase adhesion, provide a diffusion barrier, as a passivation layers, or to improve the Schottky barrier height.

Fabrication processes may include additional processing techniques as well as not use all the discussed processing techniques. Various embodiments can use only some of the techniques. Spin-on organic polymeric dielectrics such as polyimide, polynorbornenes, benzocyclobutene, polytetrafluoroethylene, and spin-on silicone dielectrics could be employed. Additionally, further fabrication steps beyond those described may be included for passivation, encapsulation, interconnects, and further varactor integration. Annealing steps maybe used to address dielectric properties and electrical contact characteristics. In another aspect of the invention, the process could be used to form a plurality of lateral varactors on a substrate. Additional modifications will become apparent to one of ordinary skill in the art. It is therefore intended that the present application not be limited to the exact forms and details described and illustrated, but fall within the scope of the claims.

What is claimed:

1. A method of forming a lateral metal insulator metal (MIM) variable capacitor comprising:
    forming at least one dielectric layer on a substrate;
    patterning and etching the at least one dielectric layer to form a patterned dielectric film structure with sidewalls;
    forming a conformal dielectric coating layer on the sidewalls and top surface of the patterned dielectric film structure;
    forming at least one metal layer on the substrate and over the patterned dielectric film structure that has the conformal dielectric coating layer such that it is buried;
    planarizing the at least one metal layer back to a dielectric level of the patterned dielectric film structure such that the metal surface and dielectric surface are substantially coplanar;
    etching the planarized at least one metal layer to form a first metal electrode and a second metal electrode on the substrate, across from each other on opposite sides of the patterned dielectric film structure, and in contact with the conformal dielectric coating layer on the sidewall of the patterned dielectric film structure.

2. The method of claim 1 wherein the at least one dielectric layer is comprised of at least one layer of a material with a dielectric constant greater than 200 at zero bias and 20-25° C.

3. The method of claim 1 wherein the at least one metal layer includes a metal from the list containing silver, copper, gold, aluminum, platinum, titanium, chromium, rhodium, ruthenium, iridium, palladium, combination thereof, or alloy thereof.

4. The method of claim 1 where the dielectric constant of the at least one dielectric layer varies according to a direct current (DC) bias applied across the first and second metal electrodes.

5. The method of claim 1 wherein said at least one dielectric layer includes at least one dielectric material from the list containing barium strontium titanate, strontium titanate, barium titanate, potassium tantalum niobate, potassium tantalate, potassium niobate, silver tantalum niobate, silver tantalate, silver niobate, lead zirconate titanate, and bismuth zinc niobate.

6. A method of forming a lateral metal insulator metal (MIM) variable capacitor comprising:
    forming a first at least one dielectric layer on a substrate;
    patterning and etching the first at least one dielectric layer and forming sidewalls;
    forming a second at least one dielectric layer over the first at least one dielectric layer;
    planarizing the second at least one dielectric layer;
    patterning and etching both the first at least one dielectric layer and the second at least one dielectric layers to form a patterned dielectric film stack structure with sidewalls;
    forming at least one metal layer on the substrate and over the patterned dielectric film stack structure such that it is buried;
    planarizing the at least one metal layer back to a dielectric level in the patterned dielectric film stack structure such that a surface of the at least one metal layer and a surface of the patterned dielectric film stack structure are substantially coplanar;
    etching the planarized at least one metal layer to form a first metal electrode and a second metal electrode on the substrate, across from each other on opposite sides of the patterned dielectric film stack structure, and in contact with a sidewall of the patterned dielectric film stack structure.

7. The method of claim 6 wherein the first at least one dielectric layer is comprised of at least one layer of a material with a dielectric constant greater than 200 at zero bias and 20-25° C.

8. The method of claim 6 wherein the at least one metal layer includes a metal from the list containing silver, copper, gold, aluminum, platinum, titanium, chromium, rhodium, ruthenium, iridium, palladium, combination thereof, or alloy thereof.

9. The method a of claim 6 where the dielectric constant of the first at least one dielectric layer varies according to a direct current (DC) bias applied across the first and second metal electrodes.

10. The method of claim 6 wherein a conformal layer of at least one dielectric material is formed on the sidewalls and top surface of the patterned dielectric film stack structure before metallization.

11. The method of claim 6 wherein said at least one dielectric layer includes at least one dielectric material from the list containing barium strontium titanate, strontium titanate, barium titanate, potassium tantalum niobate, potassium tantalate, potassium niobate, silver tantalum niobate, silver tantalate, silver niobate, lead zirconate titanate, and bismuth zinc niobate.

\* \* \* \* \*